United States Patent
Iwahori

(10) Patent No.: US 11,348,925 B2
(45) Date of Patent: May 31, 2022

(54) MATCHING NANOWIRE FET PERIODIC STRUCTUIRE TO STANDARD CELL PERIODIC STRUCTURE IN INTEGRATED CIRCUITS

(71) Applicant: SOCIONEXT INC., Kanagawa (JP)

(72) Inventor: Junji Iwahori, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 307 days.

(21) Appl. No.: 16/711,018

(22) Filed: Dec. 11, 2019

(65) Prior Publication Data

US 2020/0119022 A1 Apr. 16, 2020

Related U.S. Application Data

(63) Continuation of application No. PCT/JP2018/021733, filed on Jun. 6, 2018.

(30) Foreign Application Priority Data

Jun. 27, 2017 (JP) .............................. JP2017-125077

(51) Int. Cl.
 *H01L 29/06* (2006.01)
 *H01L 27/11* (2006.01)
 *B82Y 10/00* (2011.01)

(52) U.S. Cl.
 CPC ...... *H01L 27/1104* (2013.01); *H01L 29/0669* (2013.01); *B82Y 10/00* (2013.01)

(58) Field of Classification Search
 CPC .. H01L 27/1104; H01L 29/0669; B82Y 10/00
 See application file for complete search history.

(56) References Cited

U.S. PATENT DOCUMENTS

| | | | |
|---|---|---|---|
| 2010/0148219 | A1 | 6/2010 | Shimizu |
| 2014/0097493 | A1 | 4/2014 | Baek et al. |
| 2015/0014775 | A1 | 1/2015 | Seo et al. |
| 2015/0041924 | A1 | 2/2015 | Moroz |

(Continued)

FOREIGN PATENT DOCUMENTS

| | | |
|---|---|---|
| JP | 2010-141187 A | 6/2010 |
| JP | 2015-019067 A | 1/2015 |

OTHER PUBLICATIONS

S. Bangsaruntip, et al. "High performance and highly uniform gate-all-around silicon nanowire MOSFETs with wire size dependent scaling", Electron Devices Meeting (IEDM), 2009 IEEE International.

(Continued)

*Primary Examiner* — Khaja Ahmad
*Assistant Examiner* — Pavel G Ivanov
(74) *Attorney, Agent, or Firm* — McDermott Will & Emery LLP

(57) ABSTRACT

A semiconductor integrated circuit device using nanowire FETs has a circuit block in which a plurality of cell rows each including a plurality of standard cells lined up in the X direction are placed side by side in the Y direction. The plurality of standard cells each include a plurality of nanowires that extend in the X direction and are placed at a predetermined pitch in the Y direction. The plurality of standard cells have a cell height, that is a size in the Y direction, M times (M is an odd number) as large as half the pitch of the nanowires.

2 Claims, 7 Drawing Sheets

(56) References Cited

U.S. PATENT DOCUMENTS

2016/0125116 A1    5/2016  Liu et al.
2017/0053917 A1*   2/2017  Azmat ................ H01L 29/0649

OTHER PUBLICATIONS

Isaac Laucer, et al. "Si Nanowire CMOS Fabricated with Minimal Deviation from RMG Fin FET Technology Showing Record Performance", 2015 Symposium on VLSI Technology Digest of Technical Papers.
International Search Report and Written Opinion issued in International Patent Application No. PCT/JP2018/021733, dated Aug. 28, 2018; with partial English translation.

* cited by examiner

FIG.5

Pn=48nm,Pmmin=64nm

| n | Hc | | Pm[nm] | k |
|---|---|---|---|---|
| | [nm] | /64[track] | | |
| 16 | 384 | 6 | 64 | 0 |
| 17 | 408 | 6.375 | 68 | 0 |
| 18 | 432 | 6.75 | 72 | 1 |
| 19 | 456 | 7.125 | 76 | 2 |
| 20 | 480 | 7.5 | 64 | 0 |
| 21 | 504 | 7.875 | 72 | 1 |
| 22 | 528 | 8.25 | 66 | 0 |
| 23 | 552 | 8.625 | 69 | 1 |
| 24 | 576 | 9 | 64 | 0 |
| 25 | 600 | 9.375 | 75 | 2 |
| 26 | 624 | 9.75 | 78 | 3 |
| 27 | 648 | 10.125 | 72 | 2 |
| 28 | 672 | 10.5 | 64 | 0 |

Pn=48nm, Pmmin=64nm

| n | Hc | |
|---|---|---|
| | [nm] | /64[track] |
| 16 | 384 | 6 |
| 20 | 480 | 7.5 |
| 24 | 576 | 9 |
| 28 | 672 | 10.5 |
| 32 | 768 | 12 |
| 36 | 864 | 13.5 |

MATCHING NANOWIRE FET PERIODIC STRUCTUIRE TO STANDARD CELL PERIODIC STRUCTURE IN INTEGRATED CIRCUITS

CROSS-REFERENCE TO RELATED APPLICATIONS

This is a continuation of International Application No. PCT/JP2018/021733 filed on Jun. 6, 2018, which claims priority to Japanese Patent Application No. 2017-125077 filed on Jun. 27, 2017. The entire disclosures of these applications are incorporated by reference herein.

BACKGROUND

The present disclosure relates to a semiconductor integrated circuit device provided with standard cells using nanowire field effect transistors (FETs).

As a method for forming a semiconductor integrated circuit on a semiconductor substrate, the standard cell method is known. In the standard cell method, basic units having specific logical functions (e.g., an inverter, a latch, a flipflop, and a full adder) are prepared in advance as standard cells. A plurality of such standard cells are placed on a semiconductor substrate and connected to each other via interconnects, whereby an LSI (Large Scale Integration) chip is designed.

As for transistors that are basic constituents of an LSI, the gate length thereof have been reduced (scaled), whereby improvement in the scale of integration, reduction in operating voltage, and improvement in operation speed have been achieved. Recently, however, off-currents caused by excessive scaling and the resultant significant increase in power consumption have become a problem. To solve this problem, three-dimensional (3D) transistors of which the structure has changed from the conventional planar type to a 3D type have been vigorously studied. As one of such transistors, a nanowire FET has attracted attention.

Examples of methods for fabricating nanowire FETs are disclosed in S. Bangsaruntip, et al. "High performance and highly uniform gate-all-around silicon nanowire MOSFETs with wire size dependent scaling," Electron Devices Meeting (IEDM), 2009 IEEE International (Non-Patent Document 1) and Isaac Laucer, et al. "Si Nanowire CMOS Fabricated with Minimal Deviation from RMG Fin FET Technology Showing Record Performance," 2015 Symposium on VLSI Technology Digest of Technical Papers (Non-Patent Document 2).

SUMMARY

Until now, no concrete examinations have been made on the structure of standard cells using nanowire FETs and the layout of a semiconductor integrated circuit using nanowire FETs.

An objective of the present disclosure is providing a semiconductor integrated circuit device using nanowire FETs, in which the degree of freedom of the cell height of standard cells is enhanced without impairing the consistency with the placement of nanowires and metal interconnects.

In the first mode of the present disclosure, a semiconductor integrated circuit device includes a circuit block in which a plurality of cell rows each including a plurality of standard cells lined up in a first direction are placed side by side in a second direction perpendicular to the first direction, wherein the plurality of standard cells each include a plurality of nanowires that extend in the first direction and are placed at a first pitch in the second direction, and the plurality of standard cells have a cell height, which is a size in the second direction, M times (M is an odd number) as large as half the first pitch.

According to the first mode, the cell height of the plurality of standard cells is M times (M is an odd number) as large as half the placement pitch of the nanowires. Thus, in two standard cells placed side by side in the second direction one of which is inverted from the other, the uniformity of the placement pitch of the nanowires is maintained as a whole. It is therefore possible to enhance the degree of freedom of the cell height while maintaining the uniformity of the placement pitch of the nanowires.

In the second mode of the present disclosure, a semiconductor integrated circuit device includes: a circuit block in which a plurality of cell rows each including a plurality of standard cells lined up in a first direction are placed side by side in a second direction perpendicular to the first direction; and a macro block, wherein the plurality of standard cells each include a plurality of nanowires that extend in the first direction and are placed at a first pitch in the second direction, the plurality of standard cells have a cell height, which is a size in the second direction, N times (N is an integer) as large as half the first pitch, the circuit block has a plurality of metal interconnects that are formed in a first interconnect layer located above the plurality of nanowires, extend in the first direction, and are placed at a second pitch in the second direction, the macro block has a plurality of metal interconnects that are formed in the first interconnect layer, extend in the first direction, and are placed at a third pitch in the second direction, and the second pitch is larger than the third pitch.

According to the second mode, the cell height of the plurality of standard cells is N times (N is an integer) as large as half the placement pitch of the nanowires. Also, the placement pitch of the metal interconnects formed in the first interconnect layer located above the nanowires in the circuit block is larger than the placement pitch of those in the macro block. Thus, the cell height can be set so as to be an integer multiple of the placement pitch of the metal interconnects in units of half the placement pitch of the nanowires. It is therefore possible to enhance the degree of freedom of selection of the cell height.

According to the present disclosure, in a semiconductor integrated circuit device using nanowire FETs, the degree of freedom of the cell height of standard cells can be enhanced without impairing the consistency with the placement of nanowires and metal interconnects.

BRIEF DESCRIPTION OF THE DRAWINGS

FIG. 5 shows examples of cell heights in feature 2.

DETAILED DESCRIPTION

An embodiment of the present disclosure will be described hereinafter with reference to the accompanying drawings. In the following embodiment, it is assumed that a semiconductor integrated circuit device includes a plurality of standard cells and at least part of the standard cells includes a nanowire field effect transistor (FET).

Figure 8:
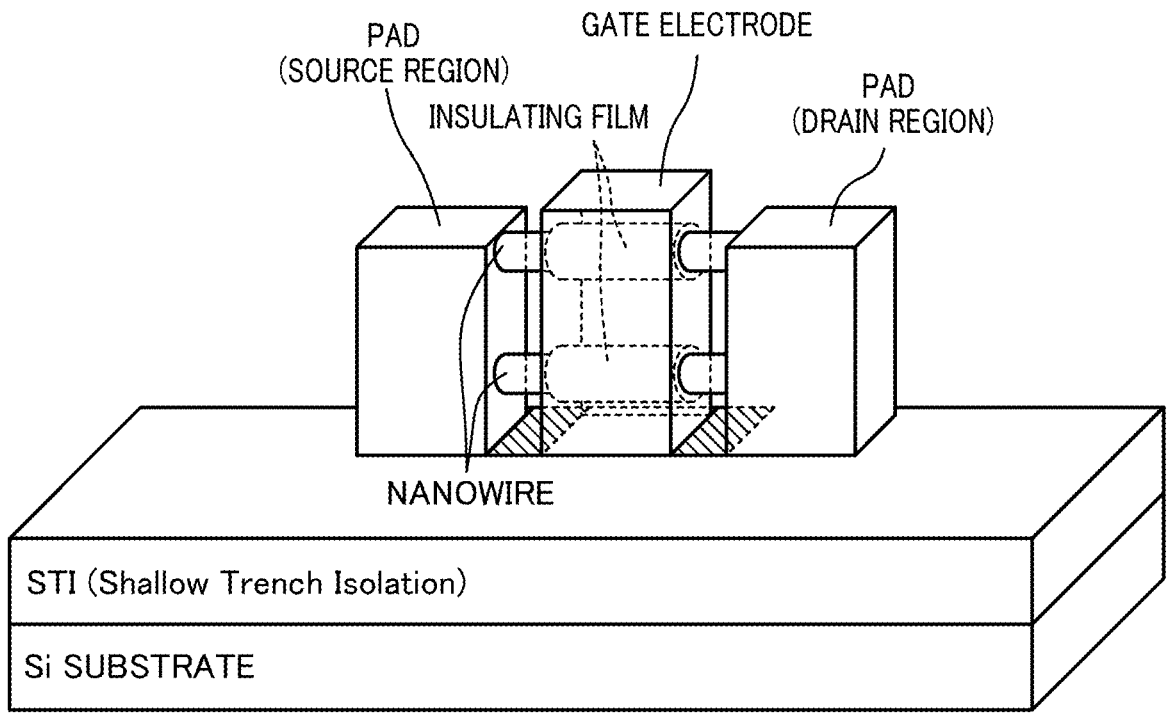
FIG. 8 is a diagrammatic view showing a basic structure of a nanowire FET.

FIG. 8 is a diagrammatic view showing an example of a basic structure of a nanowire FET (also referred to as a gate all around (GAA) structure). The nanowire FET is a FET using fine wires (nanowires) through which a current flows. The nanowires are formed of silicon, for example. As shown in FIG. 8, the nanowires are formed to extend above a substrate in the horizontal direction, i.e., in parallel with the substrate, and connected, at both ends, to structures that are to be a source region and drain region of the nanowire FET. As used herein, the structures that are connected to both ends of the nanowires and are to be the source region and drain region of the nanowire FET are referred to as the pads. In FIG. 8, although shallow trench isolation (STI) is formed on the silicon substrate, the silicon substrate is exposed in portions below the nanowires (hatched portions). Actually, the hatched portions may be covered with a thermally-oxidized film, etc. Illustration of such a film is however omitted in FIG. 8 for the sake of simplification.

The nanowires are surrounded by a gate electrode made of polysilicon, for example, via insulating films such as silicon oxide films. The pads and the gate electrode are formed on the surface of the substrate. With this structure, since the channel regions of the nanowires are covered with the gate electrode in all of their top portions, side portions, and bottom portions, the electric field is applied uniformly over the channel regions, whereby the switching characteristics of the FET are improved.

Note that, while at least the portions of the pads to which the nanowires are connected serve as the source/drain regions, portions thereof lower than the nanowire-connected portions may not necessarily serve as the source/drain regions. Also, part of the nanowires (portions that are not surrounded by the gate electrode) may serve as the source/drain regions.

In FIG. 8, two nanowires are placed in the vertical direction, i.e. in the direction perpendicular to the substrate. The number of nanowires placed in the vertical direction is not limited to two, but it may be one. Otherwise, three or more nanowires may be placed side by side in the vertical direction. Also, in FIG. 8, the top of the upper nanowire and the tops of the pads are in line with each other. However, it is unnecessary to align the positions of the tops, but the tops of the pads may be located higher than the top of the upper nanowire.

Figure 9:
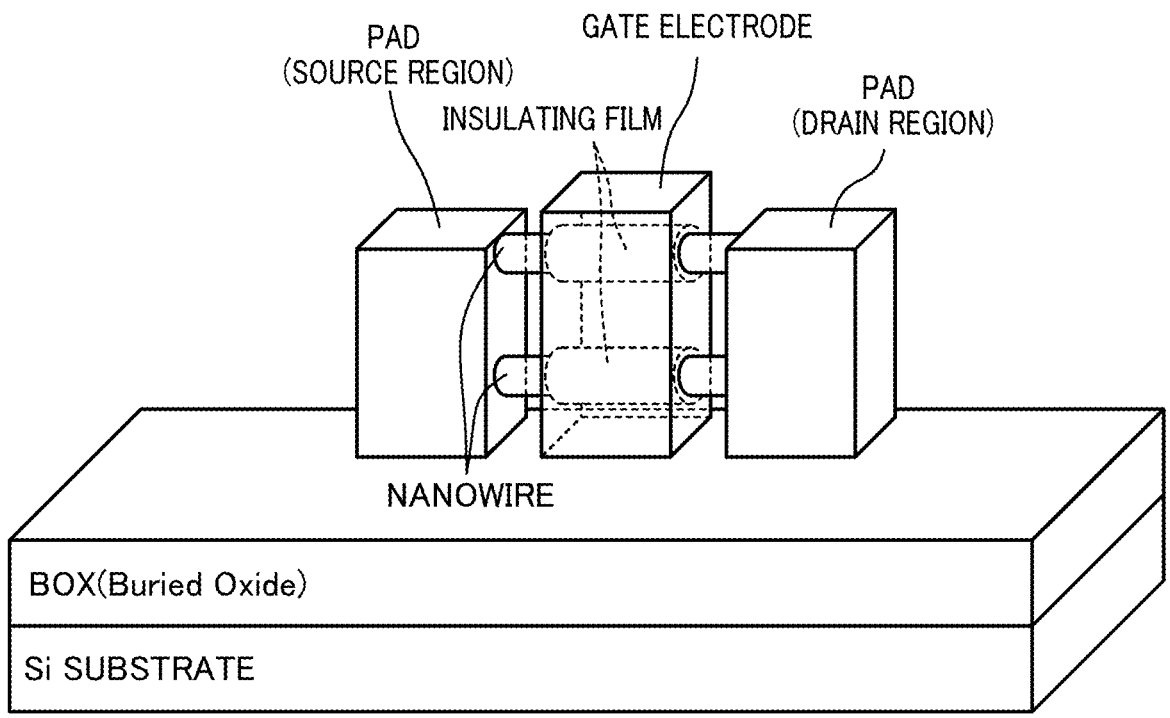
FIG. 9 is a diagrammatic view showing a basic structure of another nanowire FET.

Also, as shown in FIG. 9, buried oxide (BOX) may be formed on the top surface of the substrate, and the nanowire FET may be formed on this BOX.

Embodiment

Figure 1:
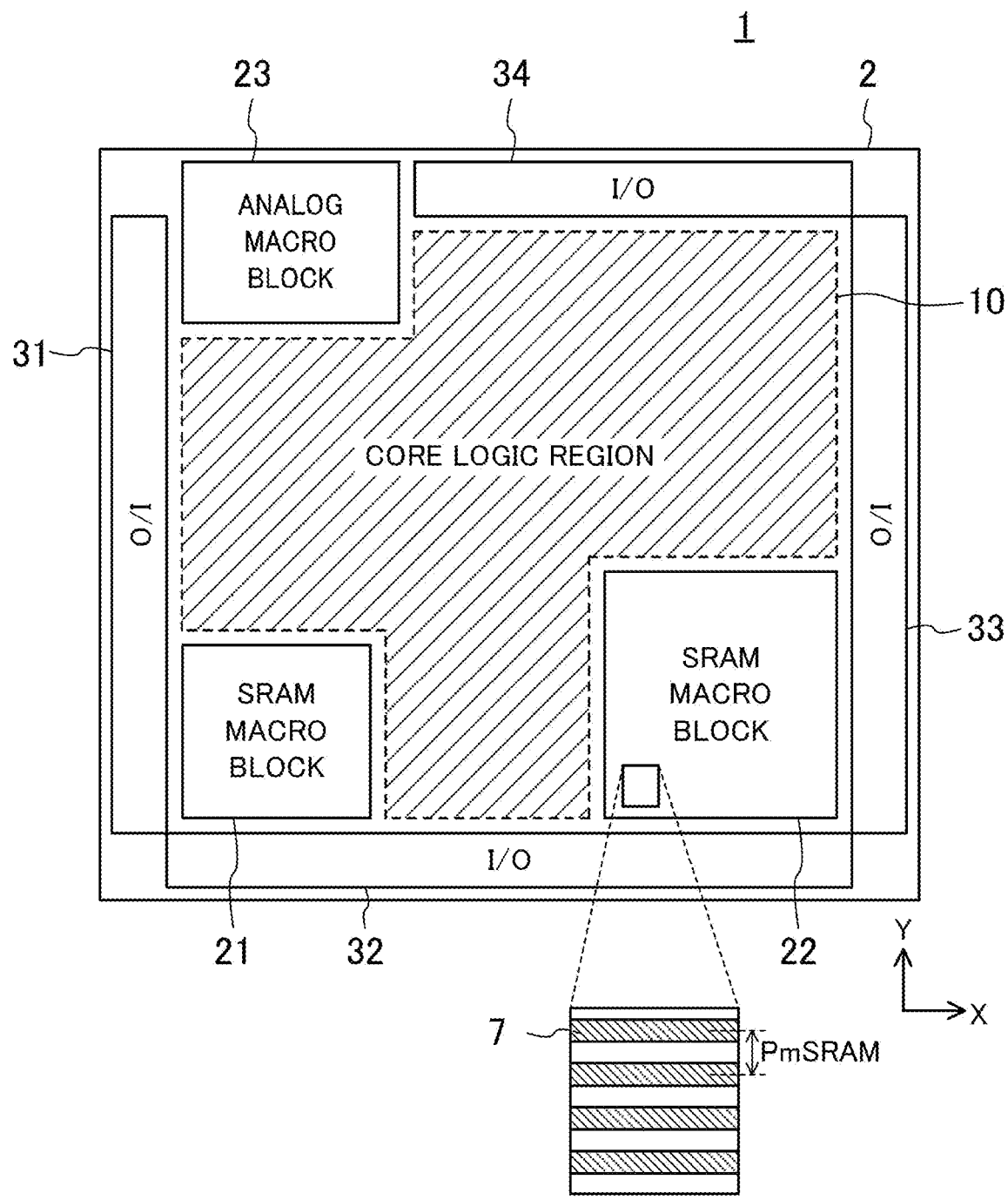
FIG. 1 is an overall block diagram of a semiconductor integrated circuit device according to an embodiment.

FIG. 1 is a plan view diagrammatically showing the entire configuration of a semiconductor integrated circuit device (semiconductor chip) according to an embodiment. The semiconductor integrated circuit device 1 shown in FIG. 1 has a core logic region 10 provided on a semiconductor substrate 2. In this disclosure, the core logic region 10 is constituted by standard cells including nanowire FETs described above (hereinafter simply referred to as "cells" as appropriate). Regions other than the core logic region 10 are also provided on the semiconductor substrate 2, which are static random access memory (SRAM) macro blocks 21 and 22, an analog macro block 23 including analog circuits such as an A/D converter and a PLL, and I/O sections 31, 32, 33, and 34 for exchanging signals, etc. with the outside of the semiconductor integrated circuit device 1.

Figure 2:
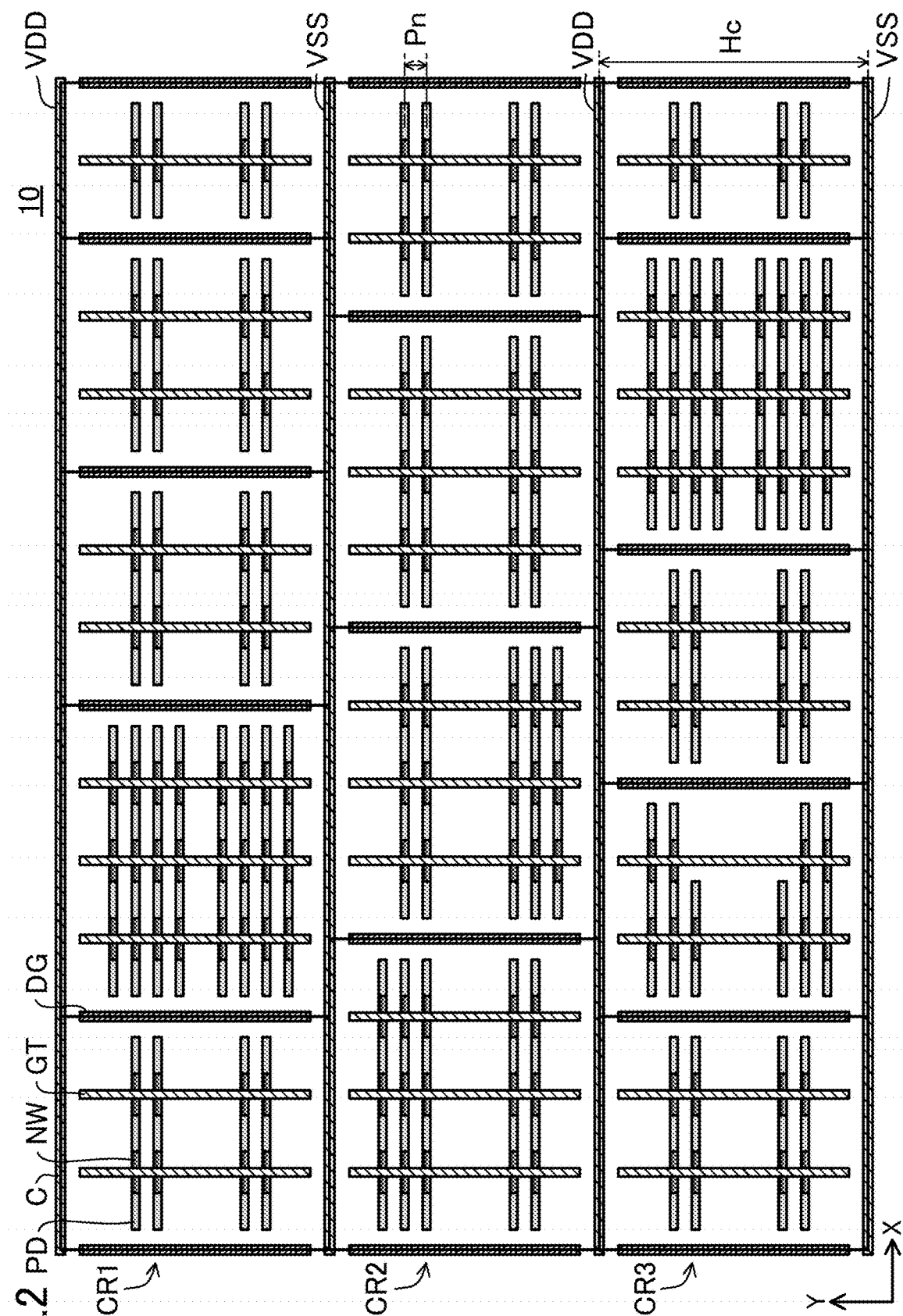
FIG. 2 is an enlarged view of part of a circuit block.

FIG. 2 is an enlarged view of part of a circuit block in the core logic region 10. In FIG. 2, NW denotes a nanowire, PD a pad, GT a gate, and DG a dummy gate. Illustration of other constituents such as interconnects is omitted. The nanowires NW are formed to extend in the X direction (horizontal direction as viewed from the figure; corresponding to the first direction), and the gates GT and the dummy gates DG are formed to extend in the Y direction (vertical direction as viewed from the figure; corresponding to the second direction). A nanowire FET includes nanowires NW and a gate GT formed surrounding the nanowires NW. As shown in FIG. 2, the core logic region 10 includes standard cells C each including such nanowire FETs. Cell rows CR1, CR2, and CR3 each have a plurality of standard cells C lined up in the X direction, and are placed side by side in the Y direction. The height of the standard cells C (size in the Y direction) is Hc. The cell rows CR1, CR2, and CR3 are flipped every other row in the Y direction. Power supply interconnects VDD and VSS are placed between the adjacent cell rows, and shared by the cell rows located on both sides in the Y direction.

According to the present disclosure, the nanowires NW are placed at a pitch Pn (corresponding to the first pitch) in the Y direction over the entire circuit block. Also, although not shown in FIG. 2, in an M2 interconnect layer (corresponding to the first interconnect layer), which is one of metal interconnect layers located above the nanowires NW, metal interconnects are placed to extend in the X direction at a pitch Pm (corresponding to the second pitch) in the Y direction over the entire circuit block. The metal interconnects formed in the M2 interconnect layer are used as inner-cell interconnects or as inter-cell interconnects. Also, as shown in FIG. 1, in a portion of the M2 interconnect layer in the SRAM macro block 22, metal interconnects 7 are placed at a pitch $Pm_{SRAM}$ (corresponding to the third pitch). It is herein assumed that the pitch $Pm_{SRAM}$ is equal to the minimum interconnect pitch $Pm_{min}$ in the semiconductor integrated circuit device 1. In the following description, it is assumed that Pn=48 nm and $Pm_{min}$=64 nm, although the lengths of Pn and $Pm_{min}$ are not limited to these.

(Feature 1)

Figure 3:
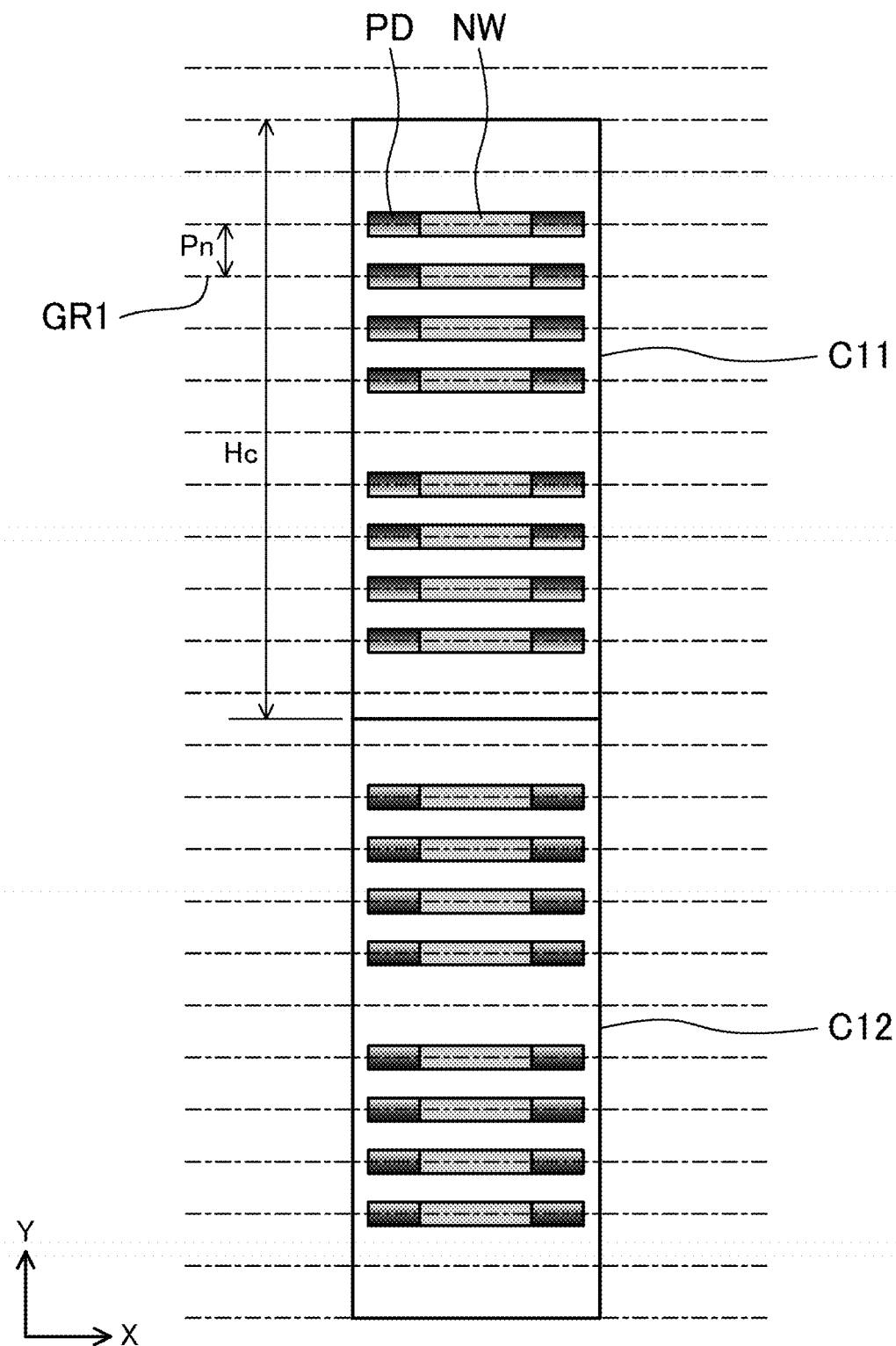
FIG. 3 shows a configuration example of standard cells illustrating feature 1.

FIG. 3 shows a configuration example of standard cells illustrating feature 1 according to the present disclosure. In FIG. 3, standard cells C11 and C12 are placed side by side in the Y direction, in which the standard cell C12 is inverted in the Y direction. In FIG. 3, dashed-dotted lines GR1 extending in the X direction are grid lines representing positions where the nanowires NW can be placed. The grid lines GR1 are arranged at the pitch Pn. The nanowires NW are placed on the grid lines GR1, although there are grid lines GR1 on which no nanowire is placed.

In FIG. 3, the cell height Hc of the standard cells C11 and C12 is 11.5 times as large as the pitch Pn of the nanowires NW, i.e. 23 times as large as half the pitch Pn of the nanowires NW. Since the standard cell C12 is inverted in the Y direction, the grid lines GR1 are arranged uniformly in the Y direction over the entire of the standard cells C11 and C12. In other words, when the cell height Hc is M times (M is an odd number) as large as half the placement pitch Pn of the nanowires NW, the uniformity of the placement pitch of the nanowires NW is maintained as a whole in two standard cells placed side by side in the Y direction one of which is inverted from the other.

As described above, by setting the cell height He as $$Hc=(Pn \times 0.5) \times M (M:\text{odd number}),$$

it is possible to enhance the degree of freedom of selection of the cell height Hc while maintaining the uniformity of the placement pitch of the nanowires NW.

(Feature 2)

Figure 4:
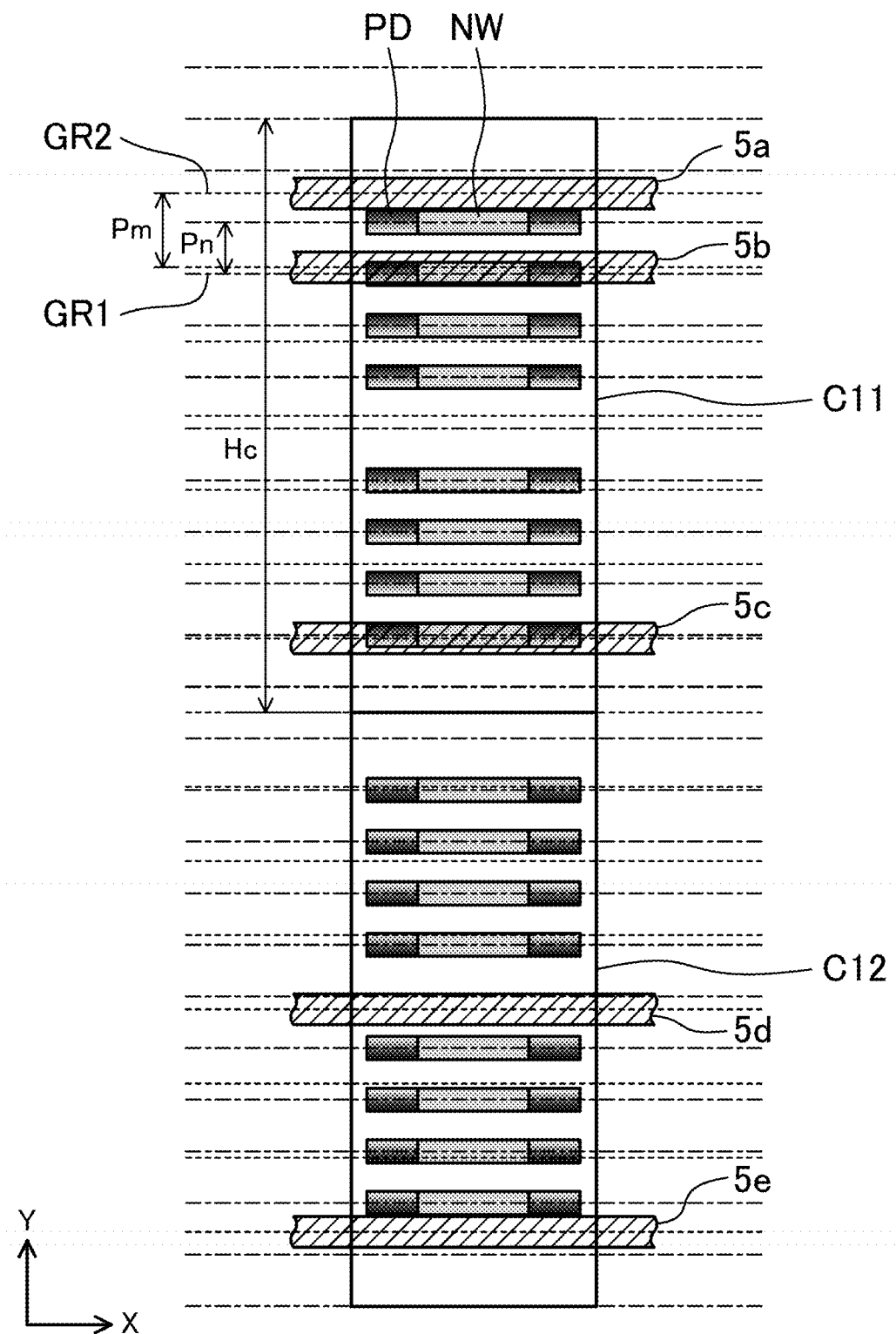
FIG. 4 shows a configuration example of standard cells illustrating feature 2.

FIG. 4 is a view illustrating metal interconnects formed in the M2 interconnect layer in the configuration example of FIG. 3. In FIG. 4, dashed lines GR2 extending in the X direction are grid lines representing the positions where the metal interconnects can be placed in the M2 interconnect layer. The grid lines GR2 are arranged at the pitch Pm. In the configuration of FIG. 4, the pitch Pm is larger than the minimum interconnect pitch $Pm_{min}$ in the semiconductor integrated circuit device 1 ($Pm > Pm_{min}$). Metal interconnects 5a to 5e are placed on the grid lines GR2, although there are grid lines GR2 on which no metal interconnect is placed. The metal interconnects 5a to 5e may be inner-cell interconnects or interconnects connecting cells.

As already described, the cell height Hc of the standard cells C11 and C12 is 11.5 times as large as the pitch Pn of the nanowires NW, i.e. 23 times as large as half the pitch Pn. Since Pn=48 nm, $$Hc = (Pn \times 0.5) \times 23$$
$$= (48 \times 0.5) \times 23 = 552 \text{ nm}.$$

In this case, since $$552/64=8.625,$$

the cell height He (=552 nm) is not an integer multiple of the minimum interconnect pitch $Pm_{min}$ (=64 nm) of the metal interconnects. This will impair the uniformity of the layout of the circuit block constituted by a plurality of standard cells and thus is undesirable.

In view of the above, in the configuration of FIG. 4, the pitch Pm of the metal interconnects is made slightly larger than the minimum interconnect pitch Pm so that the cell height Hc be an integer multiple of the pitch Pm of the metal interconnects. Specifically, Pm=69 nm is set. By this setting, $$552/69=8,$$

that is, the cell height He (=552 nm) is eight times as large as, i.e., an integer multiple of, the pitch Pm (=69 nm) of the metal interconnects. As a result, the pitch Pm of the metal interconnects is larger than the interconnect pitch $Pm_{SRAM}$ in the M2 interconnect layer in the SRAM macro block 22.

In this embodiment, the pitch Pm of the metal interconnects is set by the following equation. It is herein assumed that the pitch Pm is set in nm with 1 nm as the minimum unit from the standpoint of the layout design conditions.

$$Pm=Hc/(\text{Integer}(Hc/(0.5 \times Pm_{min}))-k) \times 2$$

where Integer ( ) is a function indicating the integer part of the value in the parentheses, and k is a variable for making an adjustment so that the value of the pitch Pm be in units of 1 nm.

FIG. 5 shows examples of the relationship between the cell height Hc and the pitch Pm of the metal interconnects.

In FIG. 5, n is a value of $Hc/(0.5 \times Pn)$, i.e., a value indicating how many times as large as half the pitch Pn of the nanowires NW the cell height He is. The configuration example of FIG. 4 corresponds to the case where n=23. The column "/64 [track]" of the cell height Hc represents a value indicating how many tracks the cell height is equivalent to at the minimum interconnect pitch $Pm_{min}$=64 nm.

As shown in FIG. 5, in this embodiment, the cell height He can be set to a value N times (N is an integer) as large as the length equivalent to half (=24 nm) the pitch Pn of the nanowires NW as the unit. The pitch Pm of the metal interconnects is adjusted so that the cell height He be an integer multiple of the pitch Pm. That is, according to this embodiment, the degree of freedom of selection of the cell height Hc can be enhanced without impairing the uniformity of the layout of the circuit block constituted by a plurality of standard cells.

Figures 6, 7:
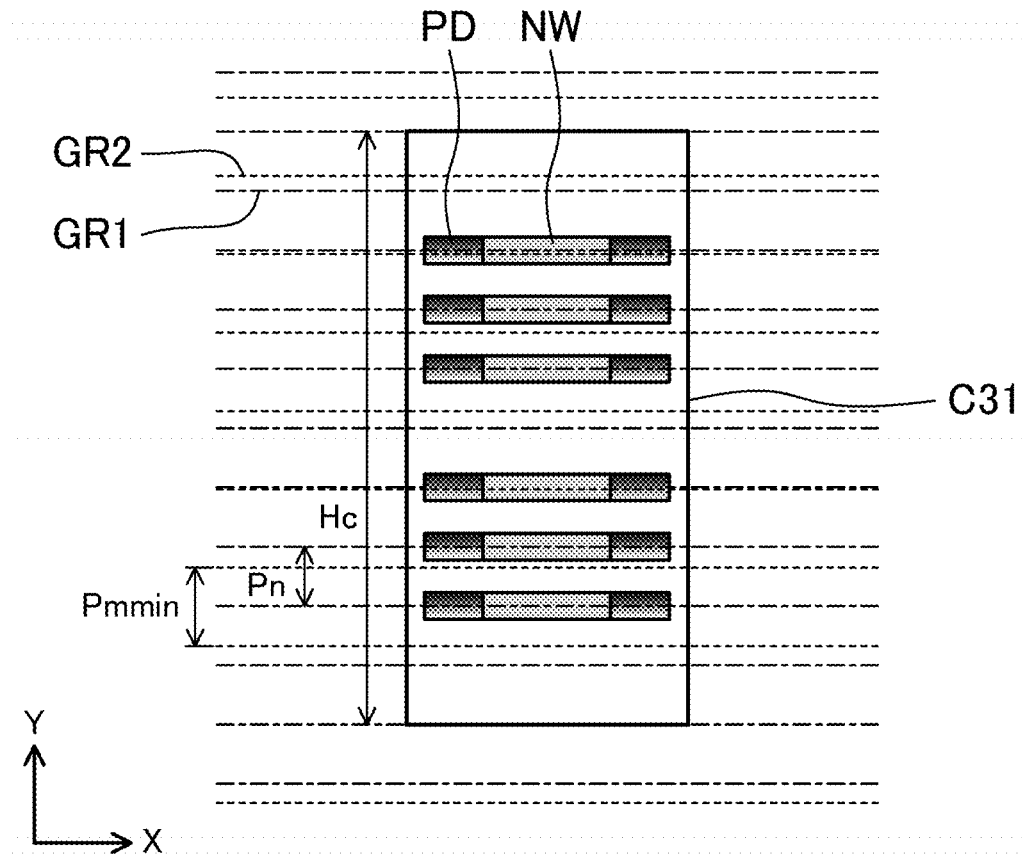
FIG. 6 shows a configuration example of standard cells in a comparative example.
FIG. 7 shows examples of cell heights in the comparative example.

FIG. 6 shows a configuration example of a comparative example, and FIG. 7 shows examples of the cell height in the comparative example. In the configuration of FIG. 6, metal interconnects are placed at the minimum interconnect pitch $Pm_{min}$ (=64 nm) in a standard cell C31. It is herein assumed that the cell height He is set to an integer multiple of the placement pitch Pn (=48 nm) of the nanowires NW and also an integer multiple of half (=32 nm) of the minimum interconnect pitch $Pm_{min}$ of the metal interconnects. In this case, as shown in FIG. 7, the cell height He can only be set in units of 96 nm that is equivalent to the least common multiple of the placement pitch Pn of the nanowires NW and half the minimum interconnect pitch $Pm_{min}$ of the metal interconnects. That is, the degree of freedom of selection of the cell height He is low compared to this embodiment.

Note that the interconnect pitch $Pm_{SRAM}$ in the M2 interconnect layer in the SRAM macro block 22 is not necessarily the same as the minimum interconnect pitch $Pm_{min}$ in the semiconductor integrated circuit device 1. Note also that, in the SRAM macro block 22, all the interconnects in the M2 interconnect layer do not necessarily have the interconnect pitch $Pm_{SRAM}$, but part of the interconnects may have the interconnect pitch $Pm_{SRAM}$. Although the SRAM macro block 22 was used herein as the object macro block for comparison of the interconnect pitch, the other macro blocks, including memory blocks such as a mask ROM and a DRAM and analog blocks such as a PLL, an A/D converter, and a D/A converter, may be used as the object for comparison of the interconnect pitch.

According to the present disclosure, in a semiconductor integrated circuit device using nanowire FEETs, the degree of freedom of the cell height of standard cells can be enhanced without impairing the consistency with the placement of nanowires and metal interconnects. The disclosure is therefore useful for improvement of the performance of a semiconductor chip, for example.

What is claimed is:

1. A semiconductor integrated circuit device comprising:
   a circuit block in which a plurality of cell rows, each including a plurality of standard cells lined up in a first direction, are placed side by side in a second direction perpendicular to the first direction; and
   a macro block,
   wherein:
   in the circuit block, the plurality of standard cells each include a plurality of nanowires that extend in the first direction and are placed at a first pitch in the second direction,
   in the circuit block, each cell of the plurality of standard cells has one and the same cell height, in the second direction, which height is N times as large as half the first pitch, wherein N is an integer, the circuit block has a first plurality of metal interconnects that are formed in a first interconnect layer located above the plurality of nanowires, extend in the first direction, and are placed at a second pitch in the second direction, the macro block has a second plurality of metal interconnects that are formed in the first interconnect layer, extend in the first direction, and are placed at a third pitch in the second direction, and the second pitch is larger than the third pitch.

2. The semiconductor integrated circuit device of claim 1, wherein the macro block is a static random access memory (SRAM) block.

\* \* \* \* \*